United States Patent [19]
Allum et al.

[11] Patent Number: 5,622,886
[45] Date of Patent: Apr. 22, 1997

[54] METHOD OF MAKING A HIGH VOLTAGE RECTIFIER FOR AN INTEGRATED CIRCUIT CHIP

[75] Inventors: Dean L. Allum, Monument; Richard B. Woodard, Elbert, both of Colo.

[73] Assignee: Atmel Corporation, San Jose, Calif.

[21] Appl. No.: 648,306

[22] Filed: May 13, 1996

Related U.S. Application Data

[63] Continuation of Ser. No. 220,747, Mar. 31, 1994, abandoned.

[51] Int. Cl.⁶ .............................. H01L 21/70; H01L 27/00
[52] U.S. Cl. ........................... 438/238; 438/286; 438/275
[58] Field of Search ................................ 437/30, 58, 59, 437/56, 51, 60

[56] References Cited

U.S. PATENT DOCUMENTS

| | | | |
|---|---|---|---|
| 4,139,880 | 2/1979 | Ulmer et al. | 361/246 |
| 4,642,878 | 2/1987 | Maeda | 29/571 |
| 4,777,580 | 10/1988 | Bingham | 363/127 |
| 4,851,361 | 7/1989 | Schumann et al. | 437/43 |
| 5,041,826 | 8/1991 | Milheiser | 340/825.54 |
| 5,061,654 | 10/1991 | Shimizu et al. | 437/70 |
| 5,166,676 | 11/1992 | Milheiser | 340/825.54 |
| 5,241,204 | 8/1993 | Kayama | 257/368 |

*Primary Examiner*—Mary Wilczewski
*Assistant Examiner*—Brian K. Dutton
*Attorney, Agent, or Firm*—Thomas Schneck

[57] ABSTRACT

A high voltage alternating current rectifier circuit for an NMOS or CMOS transistor environment in which four N-channel transistors are simultaneously fabricated distant from a utilization circuit, such as one or more EEPROM transistors. The four N-channel transistors have lightly doped sources and drains formed prior to the time gates are formed, the doping concentrations and the thickness of oxide overlying the gates selected to establish breakdown voltages exceeding 20 volt peaks. This allows an input spiral antenna or other inductor to be used for coupling radio frequency energy and signals from a remote source to a chip having a utilization circuit employing the rectifier circuit as a source of power.

8 Claims, 11 Drawing Sheets

METHOD OF MAKING A HIGH VOLTAGE RECTIFIER FOR AN INTEGRATED CIRCUIT CHIP

This application is a continuation of application Ser. No. 08/220,747 filed on Mar. 31, 1994, now abandoned.

TECHNICAL FIELD

The invention relates to power supplies, and in particular to a full wave bridge for a CMOS or NMOS integrated circuit.

BACKGROUND ART

U.S. Pat. No. 4,777,580 to D. Bingham shows a full wave rectifier circuit having a mix of bipolar and MOS transistors arranged in a bridge configuration.

U.S. Pat. No. 4,139,880 to R. Ulmer et al. discloses two p-channel MOS transistors and two n-channel MOS transistors interconnected in a circuit, similar to a full wave bridge, but providing a polarity reversal circuit.

Figure 1:
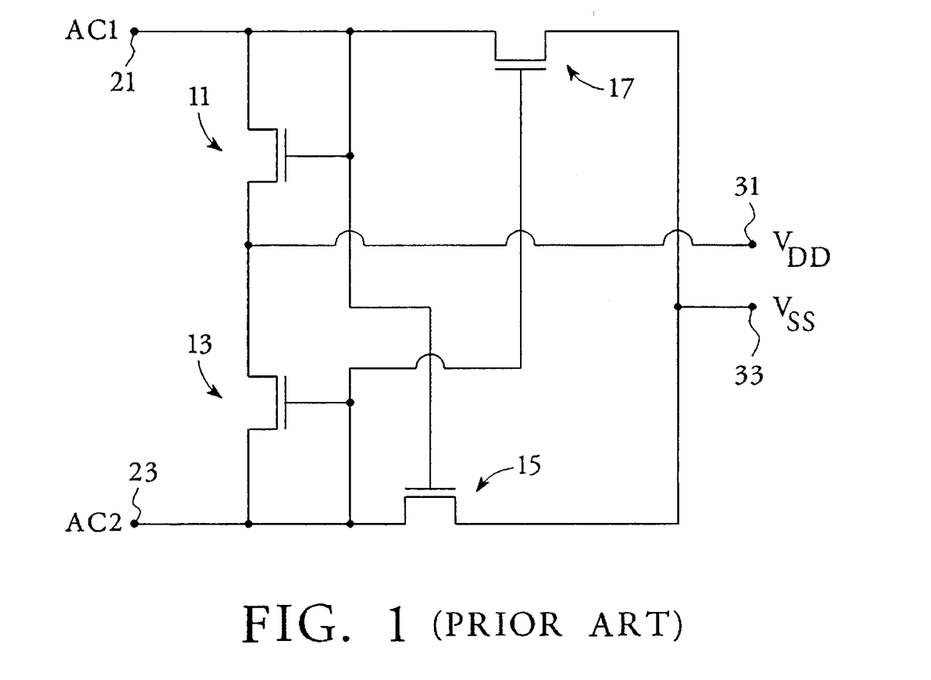
FIG. 1 is an electrical schematic of a prior art full wave rectifier.

FIG. 1 shows a prior art bridge circuit in which four n-channel MOS transistors 11, 13, 15 and 17 are employed in a full wave bridge configuration. An alternating current input is received at terminals 21 and 23. When terminal AC1 is positive, transistors 11 and 15 are in the "on" condition and transistors 13 and 17 are "off" or in a non-conducting state. The output terminal 31, $V_{DD}$, Will charge to the voltage of AC1 minus the threshold voltage of transistor 11 and an IR drop across transistor 11 which is dependent upon the amount of current required by $V_{DD}$. Output terminal 33, $V_{SS}$, will charge to the value of input terminal 23, AC2, minus the IR drop across transistor 15. When the opposite state of the alternating current input signal is placed across input terminals 21 and 23, i.e. AC2 is more positive than AC1, then transistors 13 and 17 are on and transistors 11 and 15 are off. Under these conditions, output terminal 31, $V_{DD}$ will charge to the voltage of AC2 minus the threshold voltage of transistor 13 and the IR drop across transistor 13 depending upon the current required by the output signal $V_{DD}$. Also, $V_{SS}$ will charge to the value of AC1 minus an IR drop across transistor 17. The circuit of FIG. 1 will give a full wave rectified signal between the output terminals 31 and 33. A filtering capacitor has been connected in the prior art between the terminals 31 and 33 in order to provide a rectified power signal.

Figure 2:
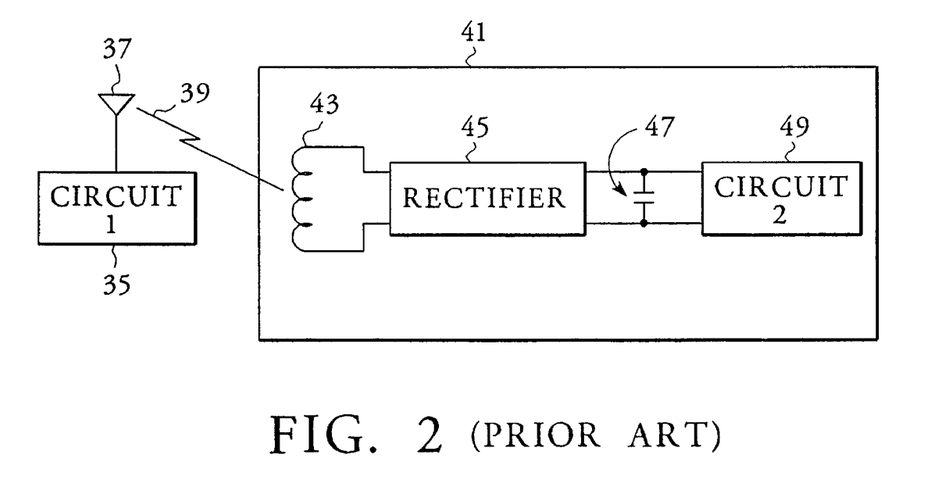
FIG. 2 is an electrical plan view of an apparatus of the prior art whereby two circuits employ the full wave rectifier of FIG. 1 to receive radiated energy which is converted to DC electrical energy.

In the prior art, a rectifier circuit of FIG. 1 has been used in a circuit of the type shown in U.S. Pat. No. 5,166,676 to T. Milheiser. In this patent an inductive input receives radio frequency energy which is fed into a coil which is disposed across the inputs of a full wave rectifier. This is shown schematically in FIG. 2 where a first transmitting circuit 35 has an antenna 37 which radiates radio frequency energy 39 to a remote passive integrated transponder 41 which includes a coil 43, a rectifier 45, similar to the one described in FIG. 1 above, and a filter capacitor 47 which smoothes ripples in the rectified radio frequency signal. The smoothed DC voltage is fed to a utilization circuit 49.

One of the problems encountered in the prior art is that the rectifier circuit of FIG. 1 will break down if input voltages exceed transistor breakdown voltages. One remedy might be to place more transistors in the rectifier circuit to distribute high voltage loads. A problem with this approach is an increased circuit complexity. An object of the invention was to devise a compact full wave rectifier having high voltage characteristics and an associated power supply circuit.

DISCLOSURE OF INVENTION

The above object has been achieved by forming n-channel, non-aligned transistors in a rectifier bridge circuit having sources and drains which are lightly doped or graded. The lightly doped or graded source and drain junctions provide for higher punchthrough and gate-aided breakdown voltages than standard MOS or CMOS transistors. The doping of source and drain regions as well as the thickness of the gate oxide should establish transistor breakdown voltages exceeding 20 volts. Remote from the four n-channel transistors which form a full wave rectifier is a utilization circuit which preferably includes EEPROM transistors which also have a pair of spaced apart source and drain electrodes with similar doping characteristics. The interconnection of the rectifier bridge transistors is done with one or two metal layers. The entire assembly may be formed in a chip package, such as a memory card for biological implant or attachment for remote communication with the package.

BEST MODE FOR CARRYING OUT THE INVENTION

FIGS. 3–18 follow the high voltage transistor manufacturing process described in U.S. Pat. No. 4,851,361 to Schumann et al., assigned to the assignee of the present invention.

Figure 3:
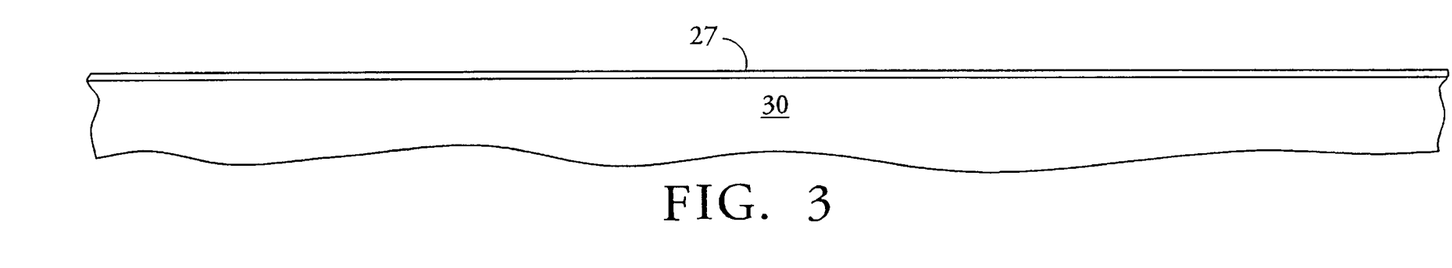
FIGS. 3–18 are side sectional views of steps for forming four N-channel high voltage transistors and a remote EEPROM transistor in the same fabrication process.

With reference to FIG. 3, the starting material is a P-type (100)-oriented monocrystalline silicon substrate which is thinned by backside etching to a desired thickness. The substrate 30 is doped to a level sufficient to provide a resistivity in the range of 5–50 ohm-cm. After extensive cleaning steps, a silicon dioxide film 27 is thermally grown to a thickness of 2000–8000 Å. The oxidation temperature of this process is about 850°–1000° C. in a steam atmosphere. This oxide layer 27 is used to define an N-well area remote from the construction of the transistors of the present invention. After N-well formation, involving an implantation step, the oxide film is removed. An N-well can be used for optional p-channel transistor formation, not described herein.

Figure 4:
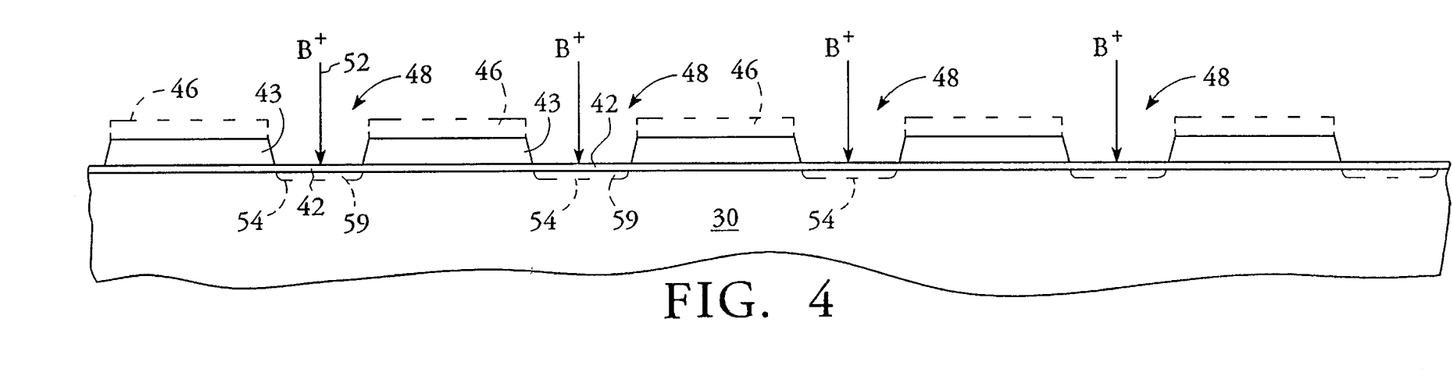

With reference to FIG. 4, the substrate 30 is then subjected to an $O_2$/HCl ambient at 900°–1000° C. to thermally grow a silicon dioxide layer 42 of 250–1000 Å thickness. On top of this oxide 42, a silicon nitride film 43 of 1000–2500 Å thickness is deposited by a low pressure chemical vapor deposition (LPCVD) method. Then, through a photolithographic step using a photoresist mask 46 this silicon nitride layer 43 is etched to define active regions. The etching is done by a plasma chemistry technique using $SF_6$ or $CF_4/O_2$ as the etchant. The silicon dioxide layer 42, grown prior to the silicon nitride deposition, assures that wafer substrate 30 is free from possible point defects or line defects, such as dislocations and subgrain boundaries, induced by the large built-in stresses (>$2 \times 10^{19}$ dyn/cm$^2$) of silicon nitride films. The thickness ratio of silicon nitride to silicon dioxide should be in the range from 1:1 to 7:1 to minimize the stress.

After removal of resist 46 and cleaning, another photolithographic step is employed in which field stop implant regions 48 are defined by a photomask. This photomask is used principally to cover any N-well regions prior to N-channel stop 59 formation. The channel stop is formed by implanting boron ions into the substrate 30 followed by a field oxidation cycle. Field boron implantation is indicated in FIG. 4 by arrows 52 and implant boundaries 54. The implant dose is about $1-4\times10^{13}/cm^2$, and an implantation energy within the approximate range of 25–50 keV is used. The reason for using a low voltage for this implantation is to prevent boron ions from penetrating through the silicon nitride layer 43 then into the substrate. Nitride layer 43 is generally thicker than that used in the prior art. The photoresist layer is stripped after implantation.

Figure 5:
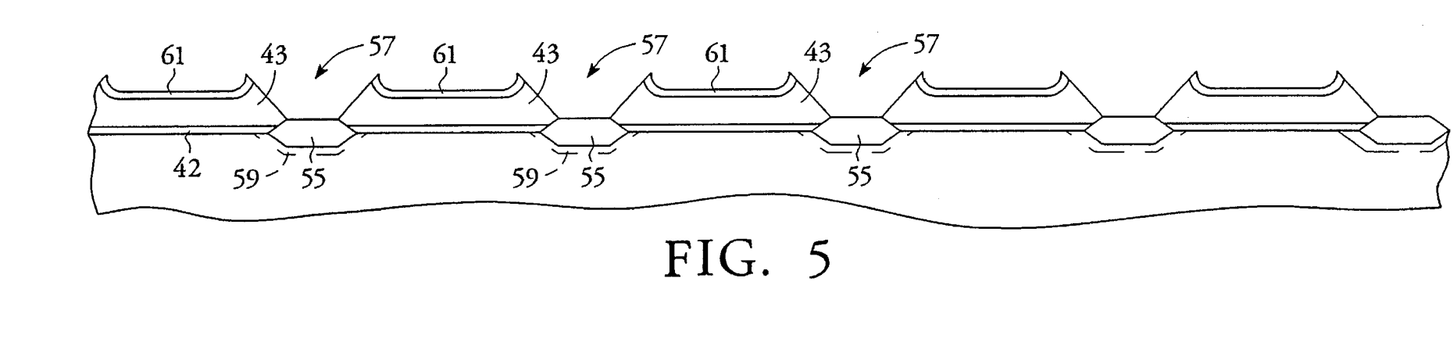

Following boron implantation, a field oxidation cycle is performed. As a result of this cycle, a 0.9–1.7 μm thick field oxide layer 55, seen in FIG. 5, is grown in the isolation areas 57 using the patterned nitride layer 43, as an oxidation mask. It is desirable that the field oxide 55 and channel stop regions 59, also seen in FIG. 5, be formed at the same time. Therefore, the field oxidation cycle includes both a high temperature (1000°–1100° C.) boron drive-in step in an $N_2$ ambient and a lower temperature (925°–975° C.) oxidation step in a steam ambient. The drive-in prior to oxidation is necessary to prevent boron in stop regions 59 from being leached out in the subsequent oxidation cycles.

Figure 6:
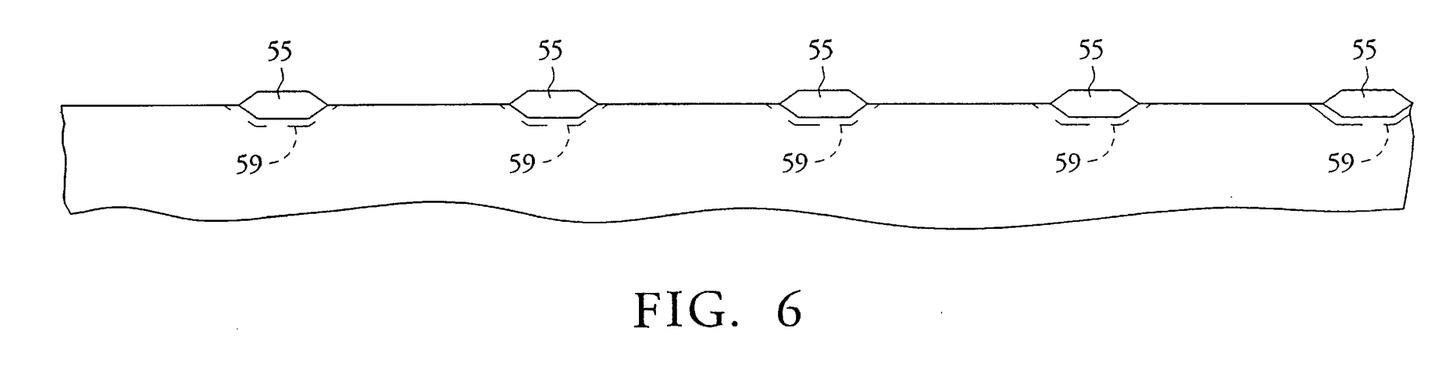

A thin silicon dioxide layer 61 is formed on the top of silicon nitride layer 43 during the field oxidation process, the top surface of silicon nitride layer 43 being converted to silicon dioxide due to the long hours process in the steam environment. The thickness of this silicon dioxide layer 61 is about 1–4% of the thickness of field oxide 55. Thus top oxide layer 61 needs to be removed before the silicon nitride layer 43. About 250–800 Å of silicon dioxide is etched off using BOE solution followed by stripping the silicon nitride layer 43 in phosphoric acid at an etch rate of 60–100 Å per minute. Lastly, the 250–1000 Å thick bottom oxide layer 42 that was under the nitride layer 43 is removed, followed by extensive wafer cleaning. The condition showing the field oxide 55 and channel stop regions 59 in FIG. 6 is the result.

Figure 7:
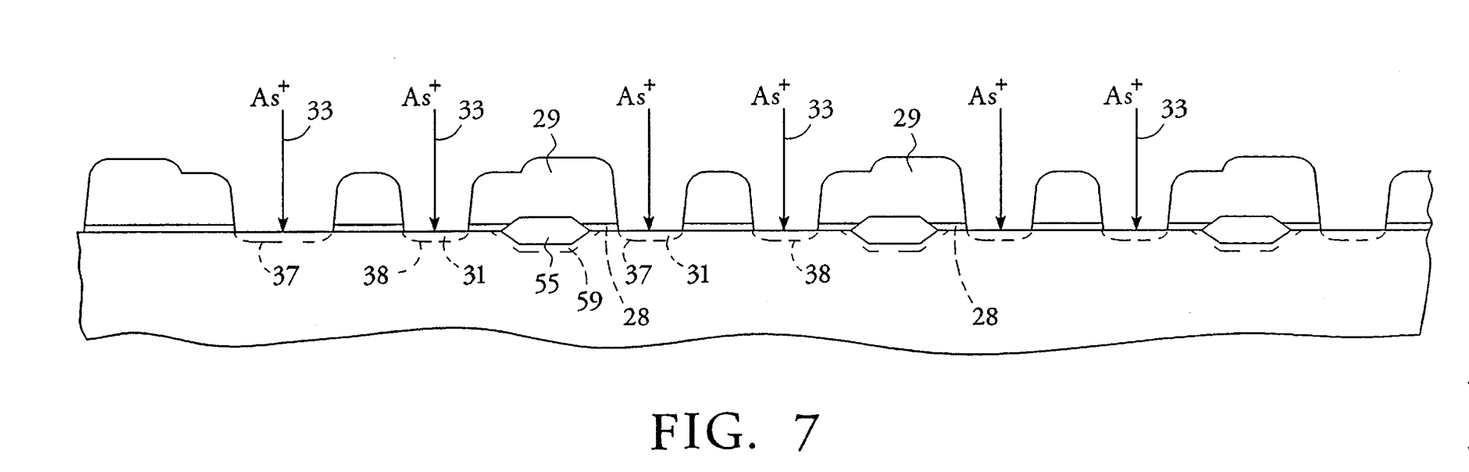
Figure 8:
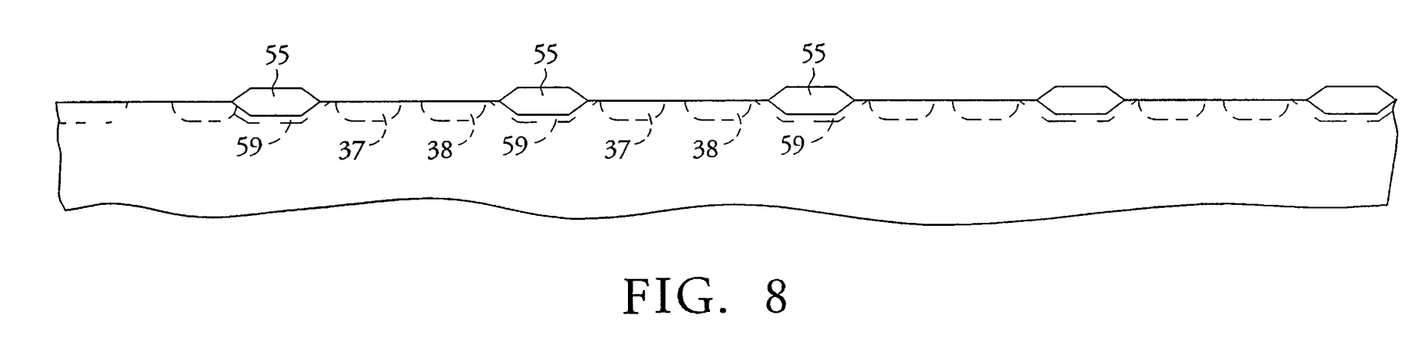

The wafer is then subject to a thin oxidation, shown in FIG. 7, to form an oxide layer of 100–400 Å for masking oxide layer 28. A photoresist mask 29 is used to define buried N+ regions 31, and the oxide 28 over these regions 31 are etched away. The buried N+ regions 31 are then formed by implant As as indicated by arrows 33 and implant boundaries 37–38 in FIG. 7. The implant dose is $0.5-3.0\times10^{14}/cm^2$. Following the implantation and resist removal, a buffed oxide etch is used to strip off oxide layer 28 to bare silicon. FIG. 8 shows the resulting structure consisting of field oxide 55, channel stop regions 59, and the implant boundaries 37–38. Then the wafer is ready for the first gate oxidation step described below with reference to FIG. 9.

Figure 9:
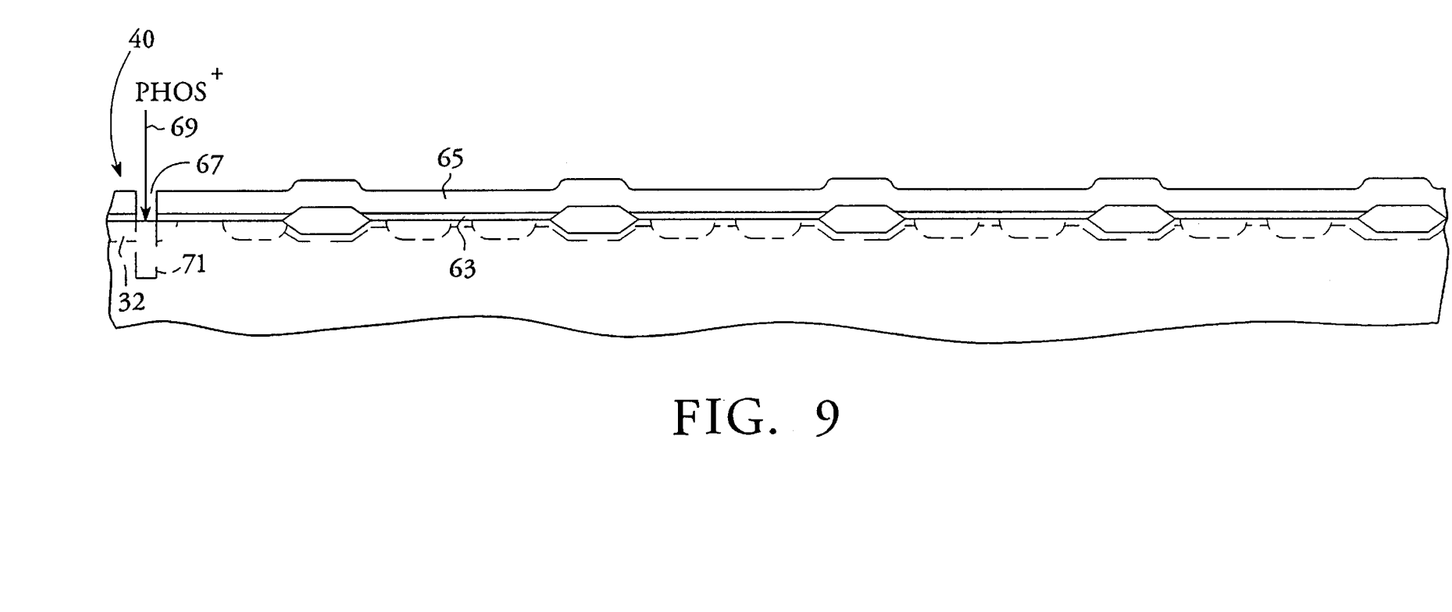

With reference to FIG. 9, the first gate oxidation 63 is grown by exposure to an alternating $O_2/HCl$ and $O_2/N_2$ atmosphere at 1000°–1100° C. The thickness of this layer 63 is 250–750 Å, and preferably about 400 Å. The first gate oxide 63 will be used in a memory cell 40. Standard photolithographic procedures, using a photoresist mask 65 and buffered oxide etchant, are used to open a small window 67 in oxide layer 63 over buried N+ region 32. Phosphorus ions are implanted through window 67, as indicated by arrow 69 and implant boundary 71, with a dose level of $5.0-9.0\times10^{13}/cm^2$. The resist is then removed, and the substrate is cleaned very carefully. An oxidation cycle at 800°–950° C. in an $O_2/N_2/HCl$ ambient is subsequently applied to form a thin silicon dioxide layer 73, seen in FIG. 10, of 60–100 Å thickness over implant boundary 71. This is followed by a heat treatment at 1000°–1050° C. in an $N_2$ atmosphere to strengthen the oxide 63 and 73.

Figure 10:
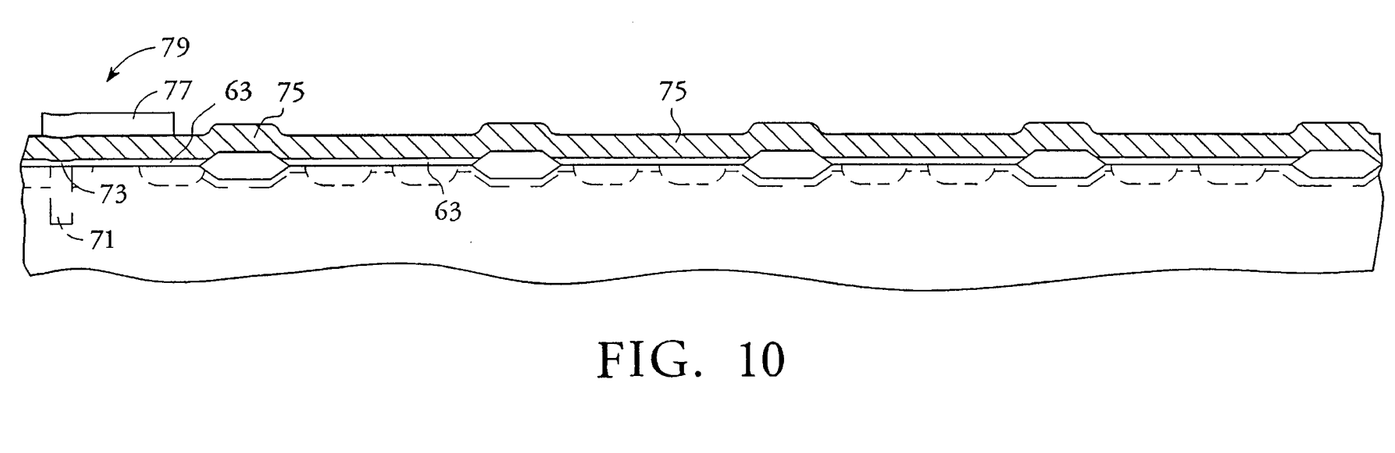

In FIG. 10, a low pressure chemical vapor deposition (LPCVD) polycrystalline silicon layer 75 of 2500–3400 Å thickness, and preferably less than 3200 Å thick, is formed over the oxide 63 and 73. The major gas used in this deposition step is $SiH_4$, Silane. The deposition temperature is 600°–700° C. Polysilicon layer 75 is thinner than the approximately 4000 Å thick. Polysilicon layer 75 is doped to achieve the desired sheet resistance. A $P_2O_5$ film is grown over layer 75 by employing $POCl_3$ and $O_2/N_2$ at a temperature of 900°–950° C. $PH_3$ (phosphine) may also be used. A sheet resistance of 20–40 ohm/square is achieved through this doping step. A buffered oxide etch is applied to remove the phosphorus glass that forms over the polysilicon during doping.

Figure 11:
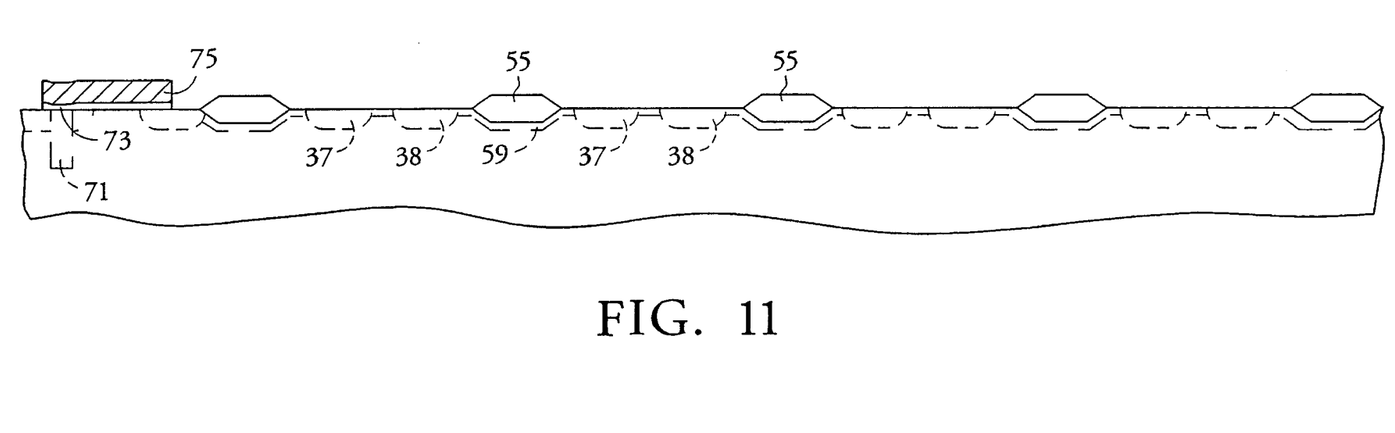

A photoresist layer 77 is next placed on the polysilicon film 75, and using regular photolithographic techniques, a floating gate area 79 for a memory cell is defined. Polysilicon layer 75 is then etched off the nonfloating gate areas not covered by resist 77 by using a plasma etch. A typical plasma chemistry chosen for this step is $CC_4/SF_6$, $Cl_2/O_2$ or $SF_6/O_2$. After etching, resist 77 is stripped, then oxide layer 63 is removed with an oxide dipout step from all wafer areas not covered by the remaining polysilicon 75 in floating gate area 79, which serves as a mask. The wafer is then subject to extensive cleaning steps and thereby exposes the field oxide 55, channel stop regions 59, implant boundaries 37, 38, and 71, thin silicon dioxide layer 73, and polysilicon layer 75 as shown in FIG. 11.

Figure 12:
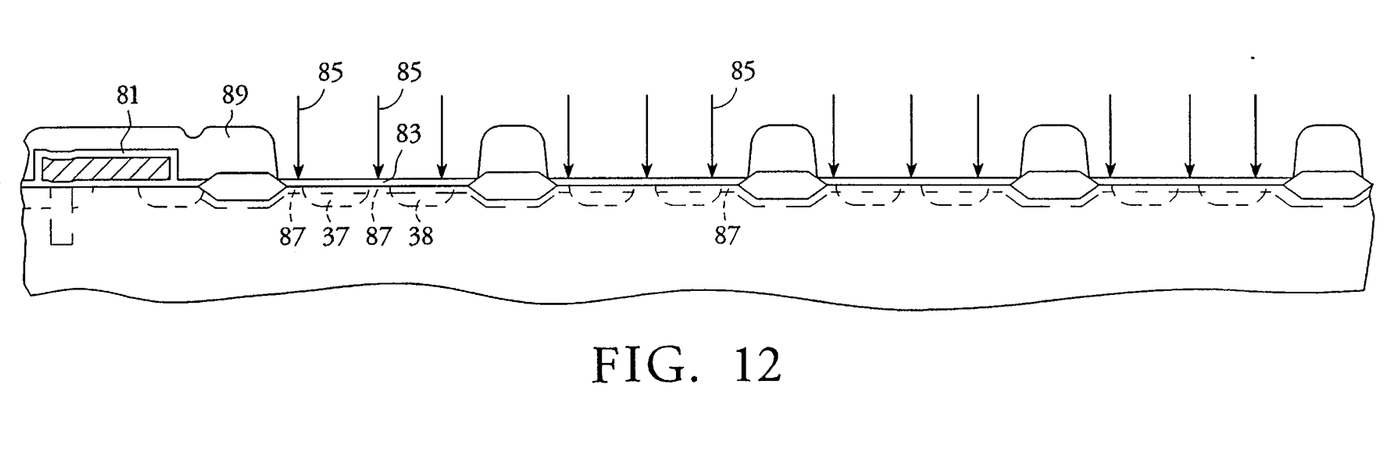

With reference to FIG. 12, the wafer is then subjected to a high temperature oxidation cycle to form the interpoly dielectric layer 81 as well as the gate oxide 83 for the high voltage transistors. This second gate oxide 81 and 83 is grown in $O_2/N_2$ atmosphere at a temperature of 1000°–1050° C. The thickness of these silicon dioxide layers 81 and 83 is between 250 Å and 360 Å. The reason for using high temperatures is to achieve better control of the relative growth rate of silicon dioxide over the polysilicon gate and the monocrystalline silicon substrate. The conventional dry oxidation process, which usually uses lower temperatures of 900°–1000° C., would grow much more oxide on polysilicon than over the substrate. The $O_2/N_2$ mixture is used to reduce the oxidation rate at these high temperatures to a reasonable and controllable rate.

To adjust the threshold voltage of enhancement devices, a boron ion implantation of dose level $6-10\times10^{11}/cm^2$ at 40–80 keV is employed, represented by arrows 85 and implant boundaries 87 in FIG. 12, for the N-channel transistors. Ordinary photolithographic techniques may be employed, using a photomask 89, to define areas for threshold adjustment. Alternatively, implantation may take place without mask 89, mask 89 being optional. If mask 89 is used, it is subsequently stripped after implantation, and the wafer is cleaned.

Figure 13:
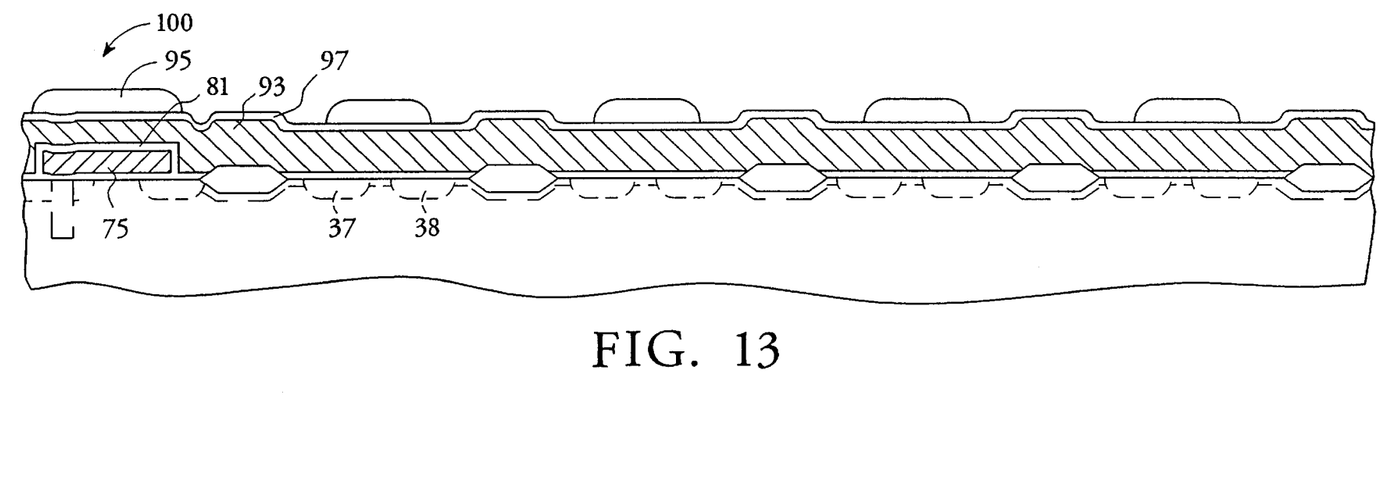

With reference to FIG. 13, a second polysilicon film 93 is applied over interpoly dielectric layer 81 and implant boundaries 37 and 38. The low pressure chemical vapor deposition (LPCVD) process used is similar to the deposition of the first polysilicon layer 75 in FIG. 10 used to form floating gate 79. The thickness of this second polysilicon layer 93 is 4000–4900 Å thick, standard for the industry. Polysilicon film 93 is then doped with phosphorus to achieve a 15–30 ohm/square sheet resistance. The doping procedure is similar to that for the first polysilicon layer 75, described above, except that a slightly higher temperature of 925°–975° C. is used. BOE is used to remove the phosphorus glass ($P_2O_5$) which is formed during the $POCl_3$ doping step. A silicide/polysilicon sandwich may replace the second polysilicon layer 93 in some high speed devices, the sandwich reducing the interconnect resistance and thereby improving device speed.

Figure 14:
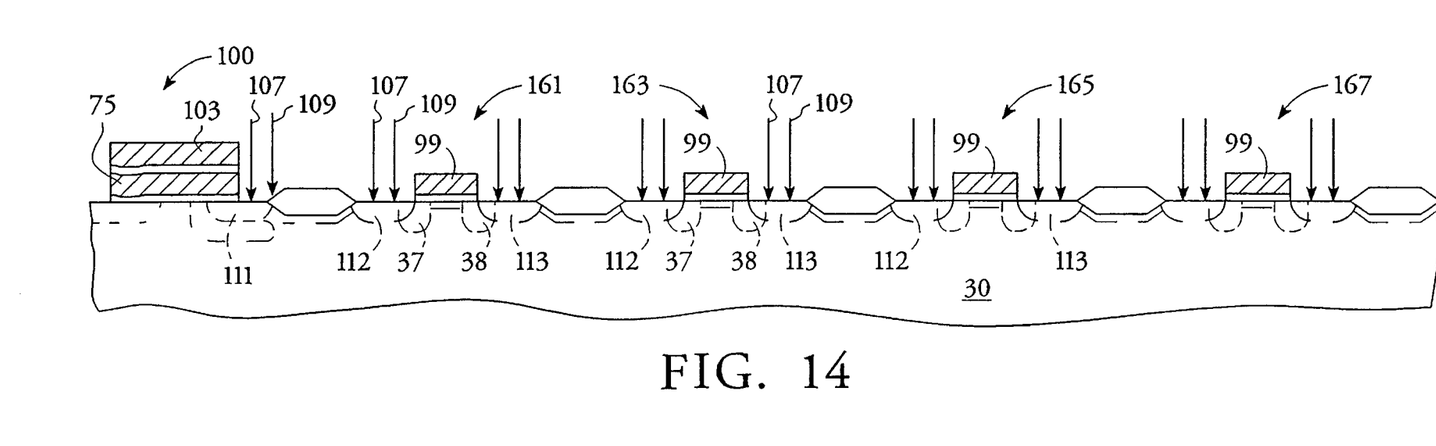

A photoresist layer 95 is used as a mask to define the shape of the second polysilicon layer 93 for the EEPROM 100. To promote adhesion of the photoresist 95 to the wafer surface, a layer 97 of silicon dioxide may be grown by the surface oxidation of second polysilicon layer 93. Oxide layer 97 is optional. With photomask 95 in place, oxide layer 97, if any, and second polysilicon layer 93 are etched. Highly anisotropic etching is preferred. The etching chemistry chosen for this step, typically $CCl_4/SF_6$, is similar to the first polysilicon etching in FIG. 10 above. As a result of etching, polysilicon gates 99 for high voltage transistors, as well as polysilicon control gates 103 for memory cells, such as EEPROM 100, seen in FIG. 14, are defined. Mask 95 is subsequently stripped.

Figure 15:
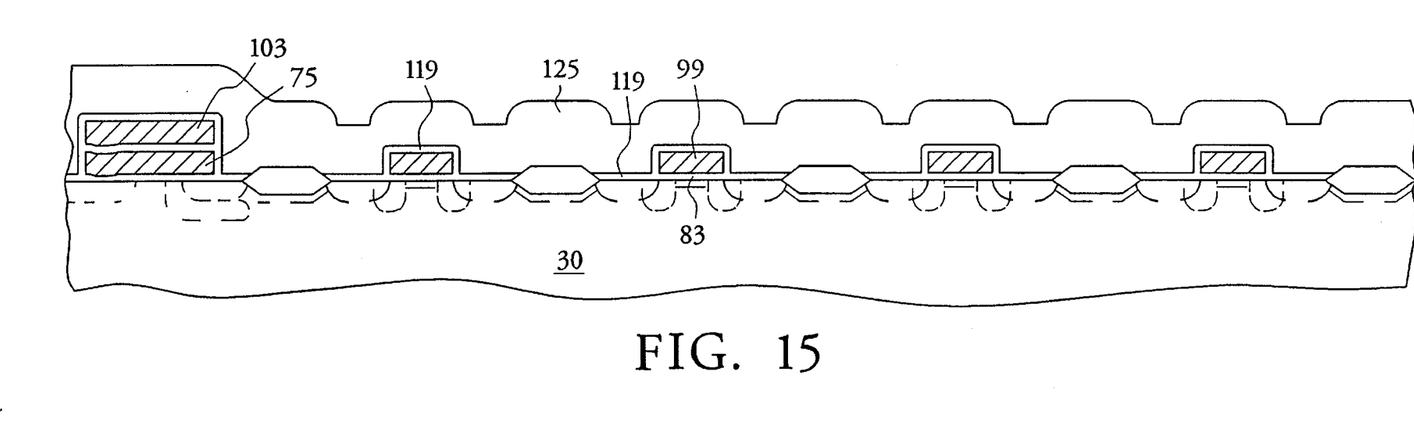
Figure 16:
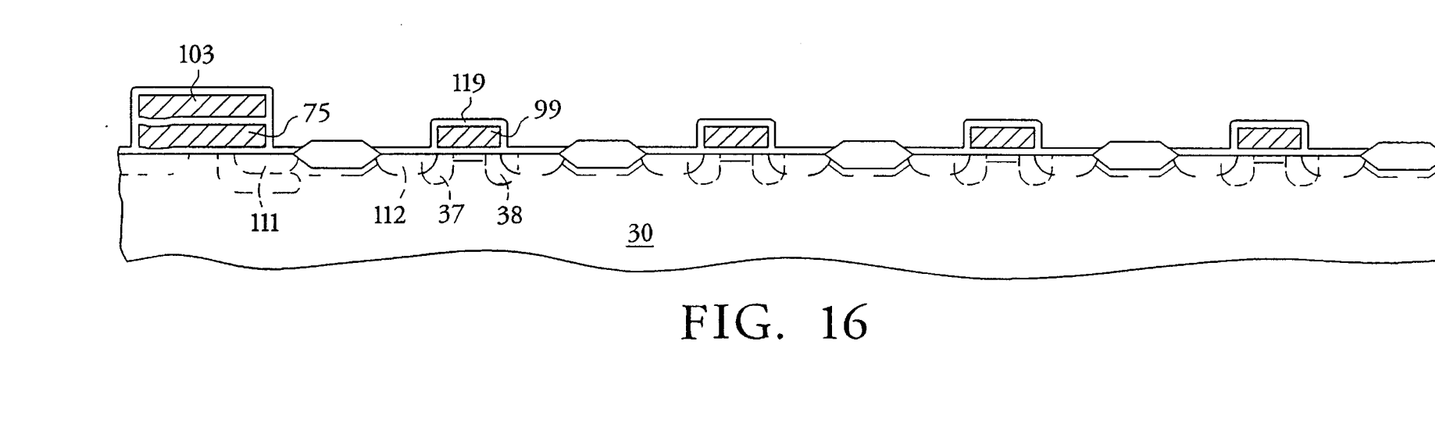

With reference to FIG. 14, to define N-channel source and drain areas in substrate 30, a photomask is placed on the wafer. The wafer is then subjected to a moderate-dose phosphorus ion implantation, indicated by arrows 107, followed by a high-dose arsenic ion implantation, indicated by arrows 109 and N+ implant boundaries 111–113. Phosphorus is implanted to a dose of $0.0-7.0\times10^{13}/cm^2$ and is used to create a graded p-n junction. Arsenic is implanted to a dose of $1-8\times10^{15}/cm^2$ at an implantation energy of about 70–100 keV. Implants 112 and 113 are contacts for the source and drain of high voltage N-channel transistors. Implant 111 is the contact for memory cell 100. Contact sources and drains extend the sources and drains beyond the buried portions of the sources and drains formed by previous implants 37 and 38 enabling conductive lines to make contact therewith without shorting with the adjacent gate. By extending the implants 37 and 38 under the polysilicon gate 99, the channel length of high voltage transistors 161, 163, 165 and 167 is made alignment insensitive, the length being determined by the spacing between implants 37 and 38. The N+ implant depth is about 0.4 µm after the end of the process. Note that gate oxide layer is removed from the exposed areas above the implantation sites prior to implantation. After the N-channel source and drain areas 112, 113 have been implanted, any remaining resist is stripped and a $SiO_2$ oxide layer 119, seen in FIG. 15, is regrown over the areas of exposed substrate. This refill oxidation is formed thermally at 900°–975° C. in an $O_2$ atmosphere. Oxide layer 119 fills up the cavities between polysilicon layers 75 and 103 and between polysilicon 75, 99, and substrate 30. It also prevents polysilicon edges from low voltage breakdown. Photomask 125 allows further patterning and etching, after which the resist is stripped to reveal polysilicon gates 103, 75, and 99 along with oxide layer 119 and electrode regions 111, 112, 37, and 38 in substrate 30, as shown in FIG. 16.

Figure 17:
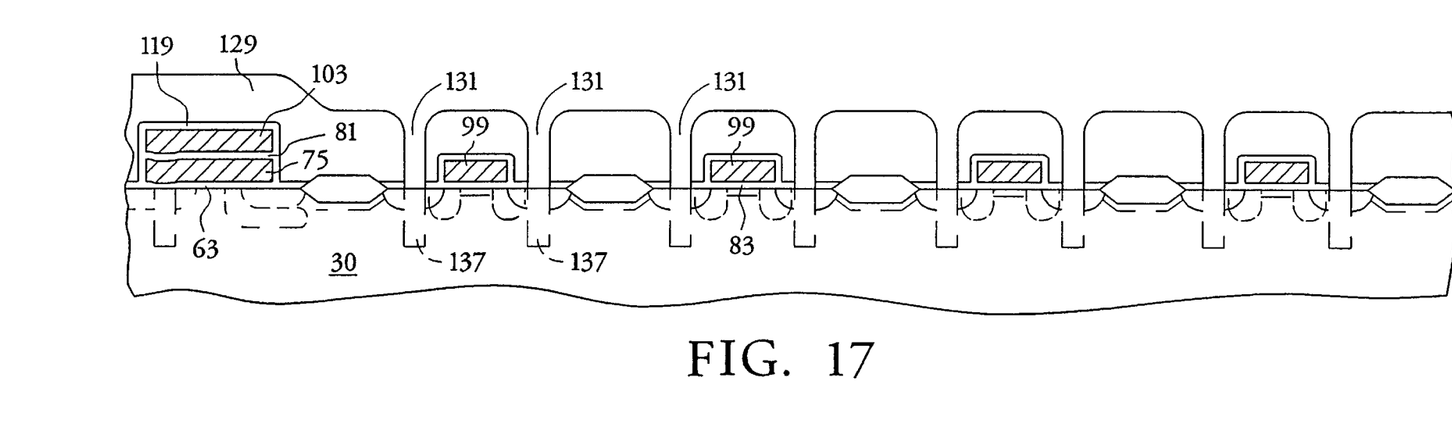

With reference to FIG. 17, a boron/phosphorus-doped silica glass (BPSG) layer 129 is next deposited on the wafer using a low pressure chemical vapor deposition technique. The concentration of boron in this glass is 2.0–4.0 wt %, while the concentration of phosphorus is about 4–8 wt %. An advantage of using BPSG over conventional PSG is that the glass flow temperature is lower for the BPSG than the PSG. A high temperature anneal step at 900°–1000° C. in alternating $H_2/O_2$ and $N_2$ ambients is employed to flow the BPSG. The thickness of BPSG layer 129 must be sufficient to cover the very high floating gate stack (gates 75 and 103 together with oxide layers 63, 81 and 119 have a total thickness of about 9000 Å.) to avoid breakdown at 25 Volts between gates 75 and 103 and subsequent metal contacts. The 1.0 to 1.5 µm thick glass 129 is accordingly about twice as thick as that found over other logic products, which need only withstand breakdown to 10 Volts.

A photomask, not shown, is placed over glass layer 129 to define contact holes 131 where metal is to make contact with the substrate 30 or the polysilicon gates 99. Plasma etching or reactive ion etching can be used to form holes 131. $CHF_3/O_2$ chemistry is typically used for this purpose. Oxygen is added to avoid polymer formation, which may block further etching of the contact holes 131. The substrate 30 is then subjected to phosphorus ion implantation, to create N+ phosphorus plugs, indicated by implant boundaries 137, for the N-channel contacts. The dose of this implant is $2-8\times10^{15}/cm^2$ at an implantation energy of 50–150 keV.

At this point, the backside of the wafer is etched to remove the silicon dioxide and polysilicon layers which have accumulated from previous growth and deposition steps. A thick coat of negative resist, 2.0–5.0 µm thick, is applied to protect the front side of the wafer. The backside of the wafer is then subjected to buffered oxide and plasma polysilicon etching clear to the original substrate. After backside etching is completed, the protective resist coat is stripped, and the wafer is put through a regular cleaning procedure.

To improve the metal step coverage, the wafer is subjected to a heat treatment at approximately 900°–1000° C. for producing reflow of the etched BPSG layer 129. Alternating $O_2/N_2$ ambients are used for this purpose. The reflow smoothes out sharp corners at the top of holes 131. The heat also activates the plug implant doping 137. Wet/dry contact etching may also be used to further round the corners. Prior to metal deposition, the substrate is subjected to a very light buffered oxide etch, so as to etch off the 300–2000 Å of silicon dioxide which is grown during the reflow process.

Figure 18:
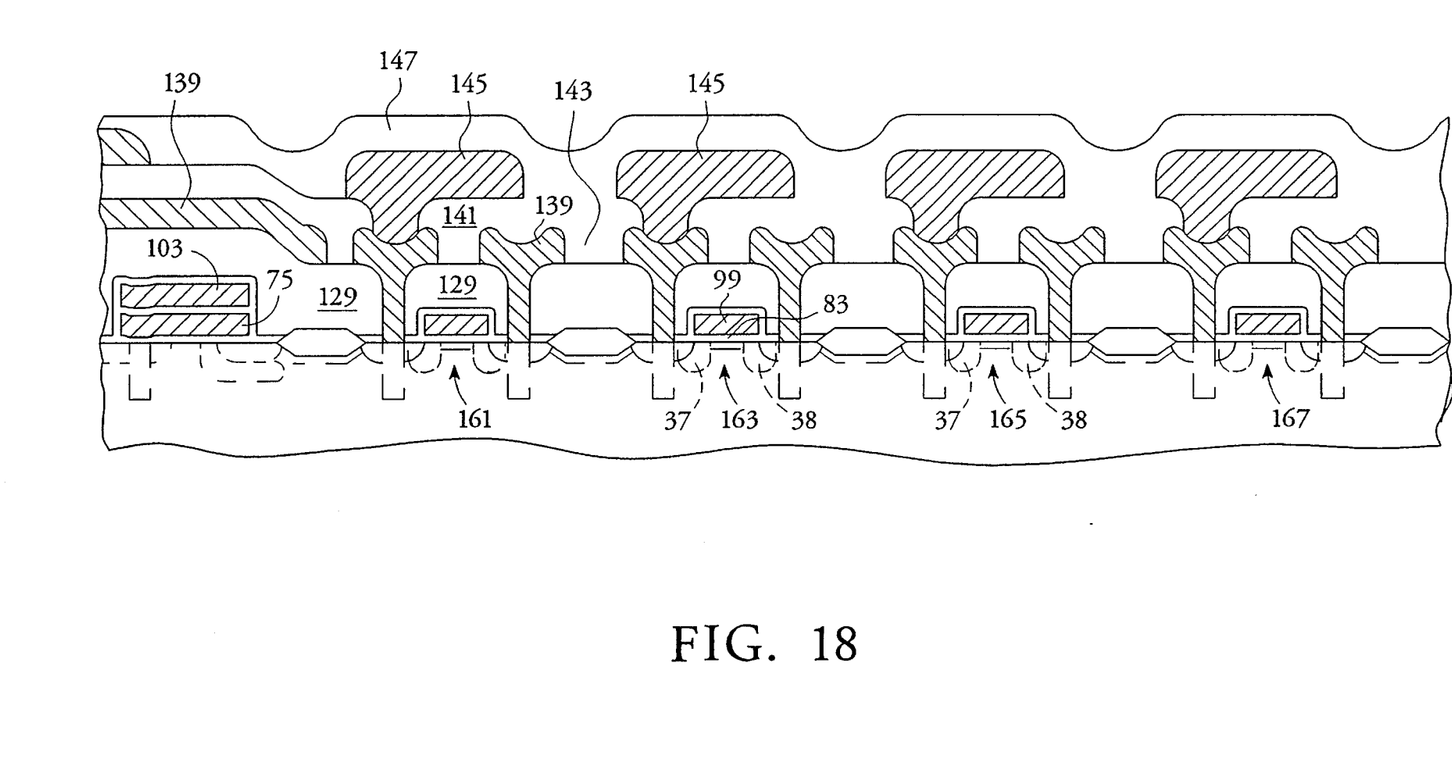

With reference to FIG. 18, an aluminum/silicon layer 139 is deposited on top of the wafer covering the polysilicon layers 103, 77, and 99, the BPSG layer 129, oxide layer 83, and electrodes 37 and 38 of transistors 161–167. The metal film 139 is about 0.6–1.2 µm thick and is 0.5–2.0% silicon. Sputtering deposition is used, and the wafer is heated up to 200°–350° C. before sputtering deposition. Employing standard photolithographic techniques, metal connection lines are defined with a photomask, not shown, and then etched using a plasma etching method in a RIE mode. Wet and dry etching gives the connection lines curved edges for better step coverage of the second metal layer. The typical chemistry for the Al/Si etch is $Cl_2$, $BCl_3$ and $O_2$. An additional $CF_4$ plasma post-treatment will be helpful to avoid metal corrosion. Resist is then removed.

For high speed devices, a double metal process is applied. An intermetal layer 141 of oxynitride, phosphorus-doped silica glass (PSG) or both is deposited over first metal layer 139. The thickness of this layer is about 6000–14000 Å. A planarization process is used to improve coverage in the subsequent second metal step. Etchback and redeposit is the technology used for this purpose. A 60–95% etchback plus redeposit to the desired thickness usually can achieve a reasonably flat wafer surface. Intermetal connect via holes 143 are defined by a photomask, followed by a wet and dry plasma/reactive ion etch and resist strip.

After a pre-deposition back sputter etching of the wafer, a second metal layer 145 is sputtering deposited over intermetal layer 141. The second metal lines are defined in the same manner as the first metal lines, i.e. by means of a photomask and plasma RIE-mode etching. In order to stabilize the surface states between metal 139 and 145, the wafer is annealed at approximately 380°–450° C. in an $N_2/H_2$ ambient. This process, known as the "alloy process", also serves to alloy the deposited aluminum to the silicon substrate for a good ohmic contact.

A passivation layer 147 is deposited over the second metal layer 145, or for single metal layer devices, over the metal layer 139. Passivation layer 147 comprises a sandwich of oxynitride and phosphorus-doped silica glass (PSG). To form passivation layer 147, PSG is deposited on the wafer by applying an atmospheric pressure chemical vapor deposition technique in silane and oxygen phosphine gases. The concentration of phosphorus in the glass is about 2–4 wt %. and the thickness of this PSG layer is about 1.0–1.3 µm. The oxynitride is deposited over the PSG by using a plasma enhanced chemical vapor technique. The thickness of oxynitride is about 3000–10000 Å with refractive index approximately 1.70–1.74. The resulting passivation layer 147 protects the fabricated integrated circuit on the wafer from moisture and contaminations.

Standard photolithographic techniques are employed to define pad openings, not shown, for probing as well as wire bonding. The oxynitride is plasma etched, while the PSG is etched with a wet oxide etching solution to open these pad areas. After removing the pad mask, a thick negative photoresist coating, 4–10 µm thick, is applied to cover the front side of the substrate. The substrate is then subjected to a backgrinding operation. The final thickness of the wafer is about 300–550 µm. Following resist removal procedures, the wafer is subjected to a light etch in buffered oxide etchant 0.8– 1.2% in concentration until the backside is dewet to prepare the backside of the substrate for chrome-gold or gold deposition. After chrome-gold deposition, the device on the substrate is exposed to ultraviolet light to erase or eliminate any possible charging up during the process, and given an electrical test in a probe assembly.

Figure 19:
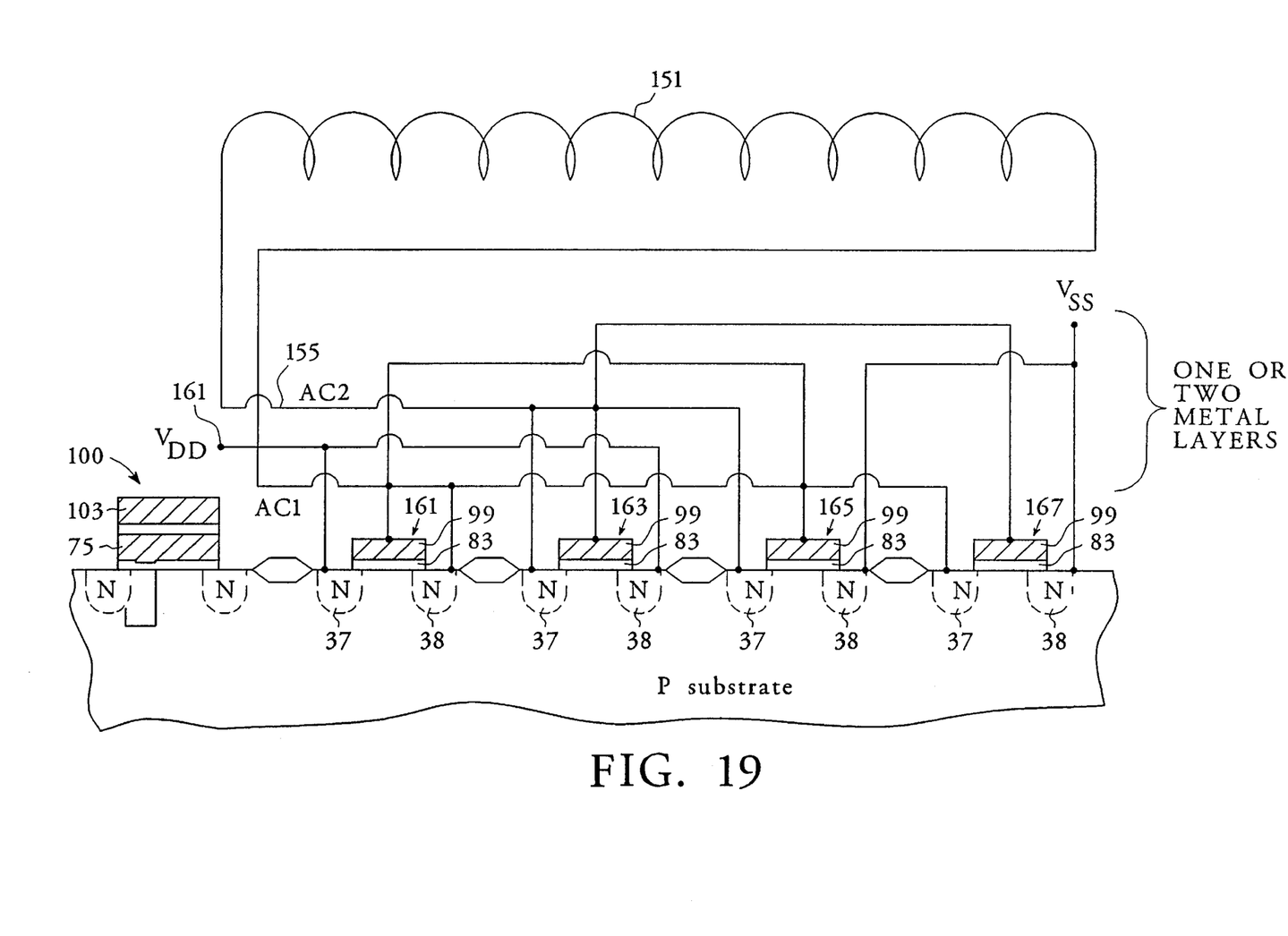
FIG. 19 is an electrical connection plan for the full wave bridge circuit of the present invention.

With reference to FIG. 19, the electrical diagram shows the memory transistor 100 spaced apart from the n-channel transistors 161, 163, 165 and 167. Electrical interconnections between the transistors are shown. These interconnections are achieved in either one or two metal layers. An inductor 151 is located near the n-channel transistors 161–167 to avoid radiative losses, with terminals AC1 and AC2 feeding the inputs of the full wave bridge of FIG. 19. The inductor may be a discrete component or a wire pattern on the substrate, as known in the art. As previously mentioned, the electrical bridge has the same electrical configuration as the bridge of FIG. 1. Breakdown voltages exceeding 20 volts are achieved.

By fabricating the circuit of the present invention in a protected encapsulated package, such as a chip card for a biological implant device, remote programming or transactions with the circuit are possible. Biological implant or attachment devices may be fish or cattle transponder tags or programmable devices such as cardiac pacers, prosthetic devices or drug release valves. Changes in programming, which sometimes require high voltage electrical signals for erasing EEPROM transistors, can be transmitted to the circuit.

Figure 20:
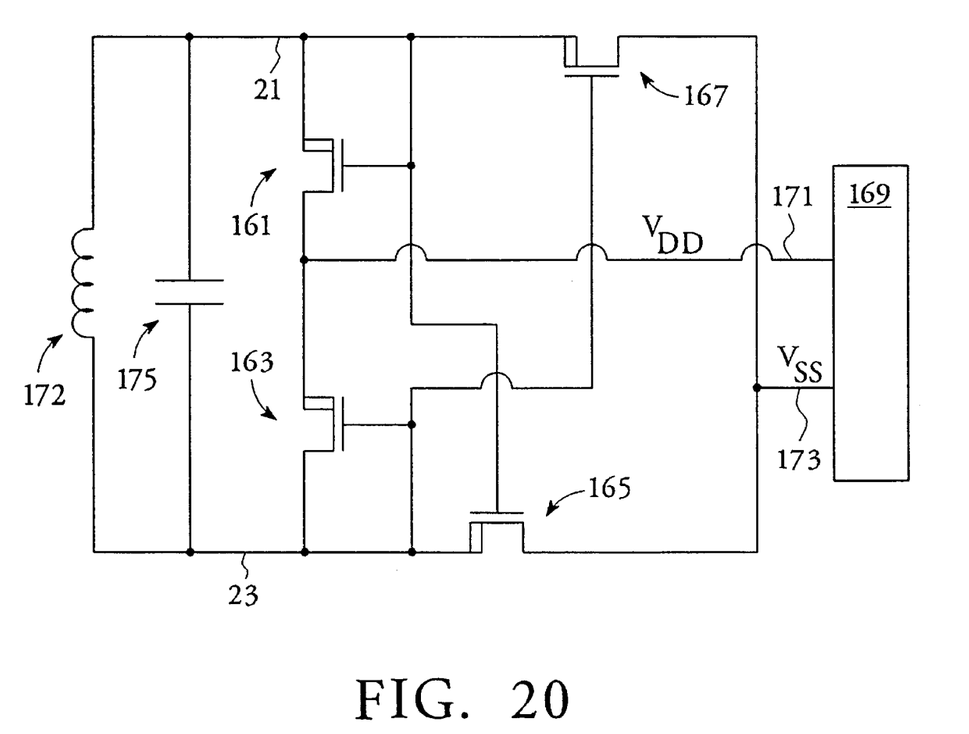
FIG. 20 is an electrical schematic of a full wave rectifier and antenna circuit in accord with the present invention.

With reference to FIG. 20, a rectifier bridge circuit is shown having high voltage, n-channel transistors 161, 163, 165 and 167. The high voltage bridge circuit rectifies AC signals which are transmitted to the circuit by means of an inductive coil 172 which feeds into the n-channel transistors. A capacitor 175 is an MOS capacitor which may be fabricated together with the transistors and placed in parallel with the inductor in order to provide a resonant circuit. Such antennas have good sensitivity and sharp selectivity. The coil and capacitor form a tank circuit which is tuned to a characteristic resonant frequency. The entire circuit may be built on a thin silicon substrate and encapsulated with a sheet plastic material, both the sheet and the encapsulation member being biologically inert. This allows biological compatibility and permits programming of an EEPROM device or array of devices or fuses. The device or array of devices may be part of utilization circuit 169 which receives the output of the high voltage rectifier over lines 171 and 173.

We claim:

1. A method of making an alternating current full wave rectifier circuit for a passive integrated transponder in an integrated circuit chip, said passive integrated transponder having a utilization circuit characterized by a predetermined maximum operating voltage comprising, forming first, second, third, and fourth MOS transistors characterized by a breakdown voltage greater than twice said maximum operating voltage of said utilization circuit, the forming of each of said first through fourth MOS transistors including the steps of forming spaced apart source and drain electrodes with each of said spaced apart source and drain electrodes consisting of a first and a second dopant region, said first dopant region being of a second conductivity type and formed by a first implant with a first dopant concentration in a semiconductor substrate of a first conductivity type, said second dopant region being of said second conductivity type and formed by a second implant with a second dopant concentration higher than said first dopant concentration, forming a gate electrode by depositing insulative material between ,said spaced apart source and drain electrodes and depositing conductive material over said insulative material to form gate regions over the insulative material, covering said spaced apart source and drain electrodes and gate electrode with an oxide, the combination of the distance between said spaced apart source and drain electrodes, dopant concentrations of said first and second dopant regions and thicknesses of said insulative material and said oxide resulting in said breakdown voltage greater than twice said maximum operating voltage of said utilization circuit, depositing conductive layers for interconnecting said spaced apart source and drain electrodes and said gate electrode of said first through fourth MOS transistors in a full wave rectifier circuit arrangement having a pair of inputs and a pair of outputs, and connecting a coil to said pair of inputs and coupling said utilization circuit to said pair of outputs for drawing power therefrom as a load.

2. The method of claim 1 wherein the substrate of a first conductivity type is a P-type silicon substrate.

3. The method of claim 1 wherein said coil is deposited on said substrate.

4. The method of claim 3 wherein said coil is a resonant circuit comprising an inductor and a capacitor.

5. The method of claim 1 wherein said substrate is disposed on a card.

6. The method of claim 1 wherein said interconnecting of electrodes is by depositing a single metal layer.

7. The method of claim 1 wherein said interconnecting of electrodes is by depositing a double metal layer.

8. The method of claim 1 wherein said coil is an antenna.

\* \* \* \* \*

UNITED STATES PATENT AND TRADEMARK OFFICE
CERTIFICATE OF CORRECTION

PATENT NO. : 5,622,886
DATED : Apr. 22, 1997
INVENTOR(S) : Dean L. Allum et al.

It is certified that error appears in the above-indentified patent and that said Letters Patent is hereby corrected as shown below:

Col. 4, lines 6-7, "than the approximately 4000 Å thick" should read -- than 4000 Å thick --.

Col. 4, line 19, "$CC_4/SF_6$, $Cl_2/O_2$ or $SF_6/O_2$" should read -- $CCl_4/SF_6$, $Cl_2/O_2$ or $SF_6/O_2$ --.

Col. 5, lines 55-56, "in alternating $H_2O_2$ and $N_2$ ambients" should read -- in alternating vapor and $N_2$ ambients --.

Signed and Sealed this

Twenty-second Day of July, 1997

Attest:

BRUCE LEHMAN

*Attesting Officer*  *Commissioner of Patents and Trademarks*